United States Patent
May et al.

(10) Patent No.: US 12,040,276 B2
(45) Date of Patent: Jul. 16, 2024

(54) DEVICE AND METHOD OF VERY HIGH DENSITY ROUTING USED WITH EMBEDDED MULTI-DIE INTERCONNECT BRIDGE

(71) Applicant: Intel Corporation, Santa Clara, CA (US)

(72) Inventors: Robert Alan May, Chandler, AZ (US); Wei-Lun Kane Jen, Chandler, AZ (US); Jonathan L. Rosch, Mesa, AZ (US); Islam A. Salama, Scottsdale, AZ (US); Kristof Darmawikarta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/888,177

(22) Filed: Aug. 15, 2022

(65) Prior Publication Data

US 2022/0392842 A1    Dec. 8, 2022

Related U.S. Application Data

(63) Continuation of application No. 16/322,423, filed as application No. PCT/US2016/054739 on Sep. 30, 2016, now Pat. No. 11,508,662.

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4853* (2013.01); *H01L 21/4857* (2013.01);
(Continued)

(58) Field of Classification Search
CPC ............ H01L 23/5381; H01L 23/5383; H01L 23/5384; H01L 23/5386;
(Continued)

(56) References Cited

U.S. PATENT DOCUMENTS 9,368,450 B1    6/2016   Gu
9,761,559 B1    9/2017   Shih
(Continued)

FOREIGN PATENT DOCUMENTS

KR    20140113467    9/2014

OTHER PUBLICATIONS

International Preliminary Report on Patentability received for PCT/US2016/054739 Apr. 11, 2019. 9 pages.
(Continued)

*Primary Examiner* — Michael Carter
*Assistant Examiner* — Lawrence C Tynes, Jr.
(74) *Attorney, Agent, or Firm* — Schwabe, Williamson & Wyatt P.C.

(57) ABSTRACT

A device and method for providing enhanced bridge structures is disclosed. A set of conducting and insulating layers are deposited and lithographically processed. The conducting layers have uFLS routing. A bridge with uFLS contacts and die disposed on the underlying structure such that the die are connected with the uFLS contacts and uFLS routing. For core-based structures, the layers are formed after the bridge is placed on the underlying structure and the die connected to the bridge through intervening conductive layers. For coreless structures, the layers are formed over the bridge and carrier, which is removed prior to bonding the die to the bridge, and the die bonded directly to the bridge.

20 Claims, 10 Drawing Sheets

(51) Int. Cl.
  *H01L 21/683*  (2006.01)
  *H01L 23/00*  (2006.01)
  *H01L 25/00*  (2006.01)
  *H01L 25/065*  (2023.01)
(52) U.S. Cl.
  CPC ........ *H01L 21/486* (2013.01); *H01L 21/6835* (2013.01); *H01L 23/5383* (2013.01); *H01L 23/5384* (2013.01); *H01L 23/5386* (2013.01); *H01L 24/16* (2013.01); *H01L 25/0655* (2013.01); *H01L 25/50* (2013.01); *H01L 2221/68372* (2013.01); *H01L 2224/16227* (2013.01)
(58) Field of Classification Search
  CPC . H01L 23/53252–53295; H01L 23/538–5385; H01L 21/4857; H01L 21/486; H01L 2221/68372; H01L 2924/15192; H01L 2224/24155; H01L 2224/24225–24227
  See application file for complete search history.

(56) References Cited

U.S. PATENT DOCUMENTS

| | | | |
|---|---|---|---|
| 2003/0157747 A1 | 8/2003 | Chen et al. | |
| 2010/0283472 A1* | 11/2010 | Thoren | G01R 31/392 324/433 |
| 2013/0283209 A1* | 10/2013 | Chung | G06F 3/0482 715/810 |
| 2014/0091474 A1* | 4/2014 | Starkston | H01L 23/5226 361/767 |
| 2014/0117552 A1 | 5/2014 | Qian et al. | |
| 2014/0299999 A1* | 10/2014 | Hu | H01L 21/561 257/774 |
| 2014/0360767 A1* | 12/2014 | Terui | H01L 24/19 174/261 |
| 2015/0289005 A1* | 10/2015 | Holmquist | H04N 21/2396 725/25 |
| 2016/0020164 A1* | 1/2016 | Terui | H01L 21/486 174/251 |
| 2016/0056102 A1 | 2/2016 | Konchady | |
| 2016/0293572 A1 | 10/2016 | We | |
| 2022/0392842 A1 | 12/2022 | May | |

OTHER PUBLICATIONS

International Search Report and Written Opinion received for PCT/US2016/054739 Jun. 27, 2017. 10 pages.
Office Action from U.S. Appl. No. 18/091,048, mailed Jun. 23, 2023, 16 pgs.
Final Office Action from U.S. Appl. No. 18/091,048, mailed Oct. 5, 2023, 16 pgs.
Notice of Allowance from U.S. Appl. No. 18/091,048, mailed Feb. 23, 2024, 11 pgs.

* cited by examiner

DEVICE AND METHOD OF VERY HIGH DENSITY ROUTING USED WITH EMBEDDED MULTI-DIE INTERCONNECT BRIDGE

CROSS-REFERENCE TO RELATED APPLICATIONS

This application is a continuation of U.S. patent application Ser. No. 16/322,423, filed on Jan. 31, 2019, which is a U.S. National Stage Filing under 35 U.S.C. 371 from International Application No. PCT/US2016/054739 filed Sep. 30, 2016 and published in English as WO 2018/063316 on Apr. 5, 2018, the entire contents of which are hereby incorporated by reference herein.

TECHNICAL FIELD

Embodiments pertain to electronic packages. Some embodiments relate to high density routing used in conjunction with an embedded multi-die interconnect bridge (bridge) in electronic packages.

BACKGROUND

The electronics industry has continued to face an ever-increasing demand for faster and more powerful processing capacity, as well as increased storage capacity to feed the continuous hunger for faster devices and data rates. Electronic packages contain a wide variety integrated circuits (ICs), dies connected to substrates, and electronic structures of a disparate array of electronic products. Examples of these products include communication devices (e.g., smart phones), computers (e.g., laptops, tablets), vehicular devices, game devices, etc. Increasing miniaturization of ICs, and IC structures to increase the processing power has led to power management and interference issues with the consequent increase in interconnect density within the structures and between dies in an electronics package.

One technology to provide dense interconnect routing between dies is an Embedded (Multi-die) Interconnect Bridge. However, due to current fabrication techniques and inherent properties of the dielectric material used to create the bridge, the use of a bridge may result in lossy and capacitive structures. Current bridge-based designs and fabrication techniques may lack flexibility and limit the number of bridge die in a single substrate and use to die having a 55 μm bump pitch of input/output (I/O) bumps on the die. It would be desirable to enable further miniaturization by providing a bridge with enhanced scalability that is capable of connecting to die having smaller bump pitches (e.g., 40 μm) without requiring a costly Si bridge re-design to implement.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

Figure 1A:
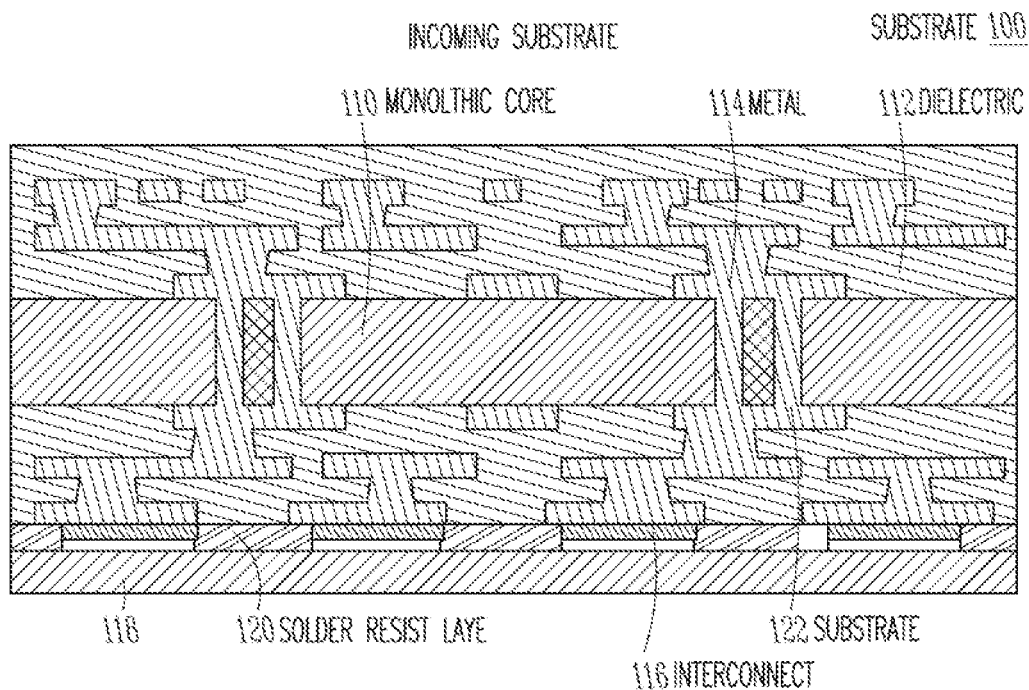
FIGS. 1A-1H illustrate cross-sectional views of a fabrication process using a bridge and very high density (VHD) routing using a substrate with a monolithic core in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Microelectronic substrates are generally composed of alternating layers of dielectric material and metal. The metal may be formed from copper, which is patterned to form conductive traces between components on the substrate. The dielectric material may be formed from inorganic materials, such as $SiO_2$ or SiN, or organic materials. Some microelectronic substrates are formed using semiconductor materials, such as Si, while others may be formed from an organic monolithic core. One or more microelectronic die having integrated circuitry therein, may be physically and electrically attached to the substrate through various bonding techniques, such as ball bonding. The die may be attached to the substrate and connected such that signals are supplied between the die and traces in the substrate. In some embodiments, the signals from one die may be routed to another die through traces in the substrate.

As above, bridge technologies may be used to provide interconnections to or between one or more die on a substrate. With the constant demand for increased processing power and device capability, it is desirable to decrease line spacing in devices in which the above technologies are implemented, using very high density (VHD) routing structures within the substrate. In particular, it may be desirable to use ultra-fine lines/spaces (uFLS) for each of the lines and spaces to increase connection interconnectivity as well as permit smaller die packages to be used. The features of uFLS routing typically have a feature size (e.g., width) of about 2 μm. Even though formation of uFLS may be desirable, processing that forms the connections to the bridge unfortunately is currently limited to a relatively wide center-to-center bump pitch. Specifically, current processing technology is limited to a pitch of greater than about 50 μm. Depending on the overall packaging architecture and the corresponding placement of the bumps on the packaged dies, the performance of the overall circuitry may in certain circumstances be limited by the bridge.

VHD routing can be used in some situations for die to die interconnection and may be scalable to a variety of bump pitches. Many configurations, such as central processing unit (CPU) to memory, may end up using 4 uFLS layers (layers containing uFLS routing and interconnects). One example of such a structure may include 2 routing layers and 2 ground layers, and may be used regardless of the I/O density available for routing. The use of 4 uFLS layers, however, may have a significant impact on yield and cost of producing the overall structure.

It may thus be desirable to augment existing bridges with VHD routing in certain situations, without using multiple uFLS layers. In particular, an alternative to VHD routing is to use the existing bridge for interconnections that would otherwise use the 4 layers and use a single layer VHD for more flexible applications. Examples of these latter applications include CPU to CPU where optimization of the CPU pinouts may be achieved based on the CPU developer, and thus simplifying development. This may enable the bridge to be used with a 40 μm or smaller bump pitch. The use of a single layer VHD with the bridge may also enable a single uFLS layer to be used as a space transformer, which is able to adjust the spacing through the thickness of the layer. The single uFLS layer may be used to reconfigure multiple logic or memory die to work with the same bridge. This may reduce the time between, for example, a system memory down selection and package availability by eliminating the lead time to re-design and build bridge die.

FIGS. 1A-1H illustrate cross-sectional views of a fabrication process using a bridge and VHD routing using a substrate with a monolithic core in accordance with some embodiments. The process shown in FIGS. 1A-1H involve patterning uFLS of about 2/2 μm each, which are unable to be formed using conventional processing methods in which bridges are also used. Embedded traces, self-aligned vias and/or zero misalignment vias may be used in the processes shown. In some embodiments, a photo imagable dielectric may be used to form the VHD routing and connect to small vias to the bridges. The processing may be used to fabricate the structure (lines, spaces and vias) through lithographic processes. In some embodiments, the lithographic processes may include laminating the underlying structure (e.g., substrate) with a dry film photoresist. The photoresist may then be patterned by exposure to radiation, such as visible or ultraviolet light. The exposure crosslinks the exposed portion of the dry film photoresist. The unexposed portions of the dry film photoresist may be removed in a developing step, for example, using a developer having about 1% sodium carbonate. The exposed portions of the dry film photoresist can then be electroplated with Cu to form the desired pattern and the exposed portions of the dry film photoresist subsequently removed if desired. In other embodiments, a negative dry film photoresist may be used, in which the exposed portions of the dry film photoresist may be removed in the developing step. In some embodiments, double patterning may be used to form vias. In particular, routing may be provided on a dielectric layer, and the routing followed by re-patterning using lithographic techniques and subsequent plating to form the via. In some embodiments, the use of a masked excimer or $CO_2$ laser may be avoided when forming the VHD routing. In various embodiments, such a laser may or may not be used to create various vias shown in FIGS. 1A-1H.

FIG. 1A shows a substrate 100 formed in accordance with established techniques. The substrate 100 may have a monolithic core 110 formed from an organic material, perhaps containing glass. On one or both sides of the monolithic core 110 alternating layers of dielectric material 112 and metal 114 may be formed and patterned to provide signal routing. The dielectric layer 112 may be formed from an organic insulating material, such as an Ajinomoto build-up film (ABF) layer, and the metal layer 114 may be formed from copper. Each of the dielectric layer 112 and the metal layer 114 may have a thickness of about 10-30 μm, typically ranging from 15-20 μm. from an organic material perhaps containing glass. A total of six layers are shown in FIG. 1A, although there may be a greater or fewer number of layers on the substrate 100 prior to further processing.

As shown in FIG. 1A, dielectric layers 112 and metal layers 114 may be formed on opposite sides of the core 110. The structure may be substantially symmetric around the core 110; each dielectric layer 112 and metal layer 114 may have the same layout as a corresponding layer on the side of the core 110. To provide signal routing from the front side of the substrate 100 to the back side of the substrate 100, the core 110 may be permeated with one or more vias 122. On the back side of the substrate 100, the topmost metal layer 114 may have a solder resist layer 120 patterned such that metal interconnects 116 formed from gold, for example, is plated to exposed portions of the topmost metal layer 114. A protective film 118 may be formed over the metal interconnects 116 and solder resist layer 120. The protective film 118 may be separated from the metal interconnects 116 such that no contact exists between the protective film 118 and the metal interconnects 116.

Figure 1B:
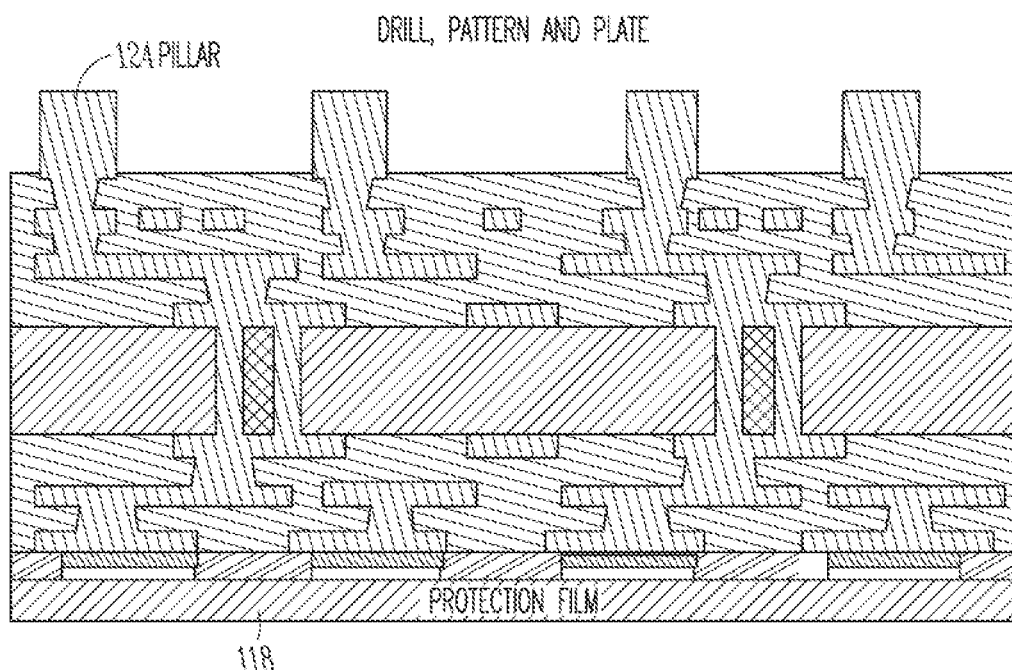

The front side of the core 110 may terminate with a dielectric layer 112. It is this top side that may further be subjected to processing to provide the bridge. As shown in FIG. 1B, copper pillars 124 are plated on the front side to a height just above the thickness of the bridge die. This height may be about 40-60 μm. In particular, an ABF or other organic dielectric layer is provided over the topmost layer shown in FIG. 1A. The dielectric layer is then patterned and etched using a lithographic process to form holes in the dielectric layer to the topmost metal layer 114 at predetermined locations. The lithographic process may include deposition and patterning of a photoresist to expose predetermined portions of the underlying structure, deposition of the metal or dielectric layer and stripping of the remaining photoresist thereafter to leave the metal or dielectric layer only on the exposed portions of the structure. Metal is then plated on the structure, in some embodiments using an electroless Cu process, and the dielectric layer stripped away to form the Cu pillars 124.

Figure 1C:
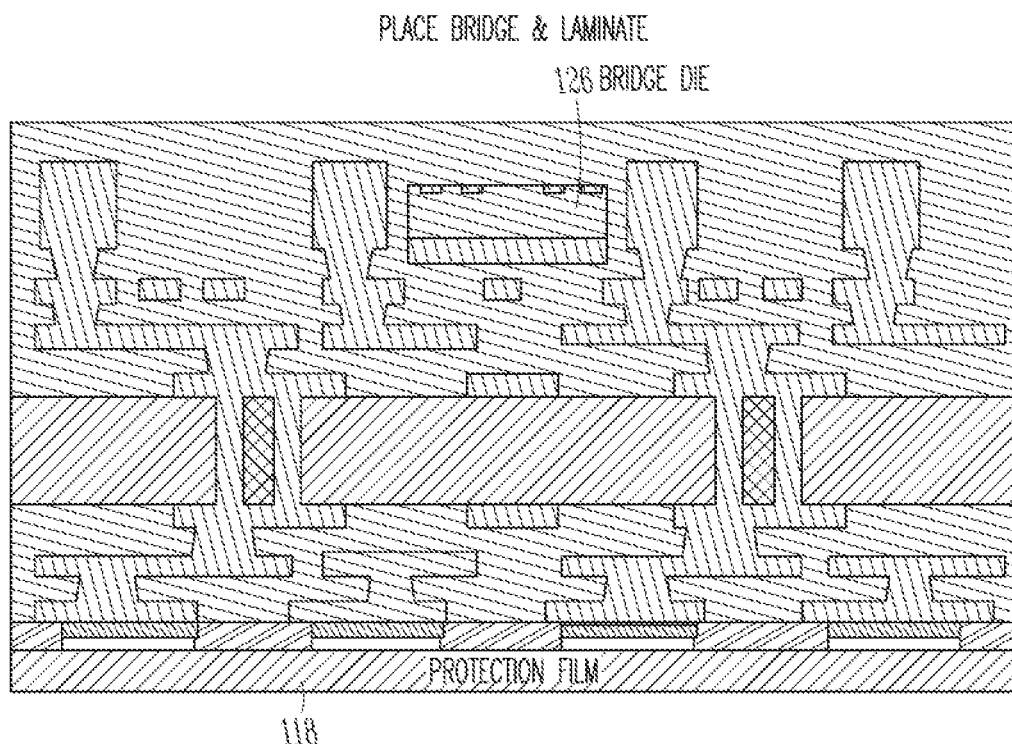

In FIG. 1C, the bridge die 126 containing the uFLS is disposed on the structure shown in FIG. 1B, with the uFLS contacts disposed towards the outer portion of the substrate 100. The Cu pillars 124 extend further upwards than the bridge die 126. Another dielectric layer is subsequently laminated on the resulting structure. This dielectric layer covers both the bridge die 126 and the Cu pillars 124.

Figure 1D:
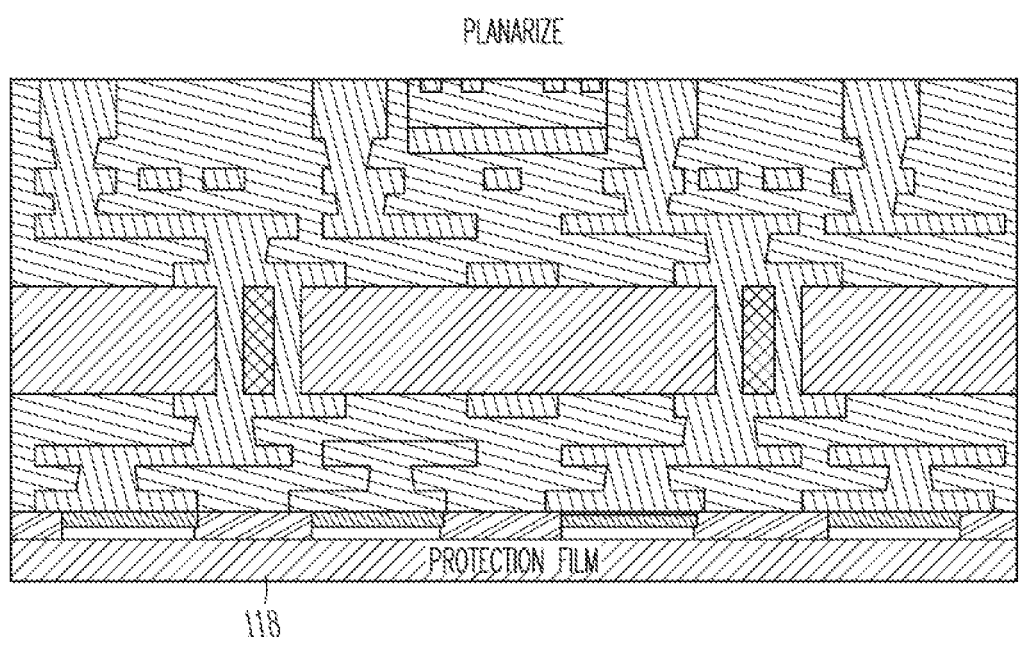

After lamination of the dielectric layer, the surface is planarized as shown in FIG. 1D. The planarization may bring the surface down to the level of the bridge die 126. In fact, the bridge die 126 can be used for endpoint detection for the planarizer. In particular, the outer pads on the existing bridge die 126 may be 6 μm thick, a margin of 1-2 μm thus may exist for grinding into the bridge die 126. In some embodiments, however, planarizing into the bridge die 126 may be undesirable. In such cases, the planarization endpoint can be set above the bridge die 126 and a thickness target on the Cu pillars 124 may be adjusted.

Figure 1E:
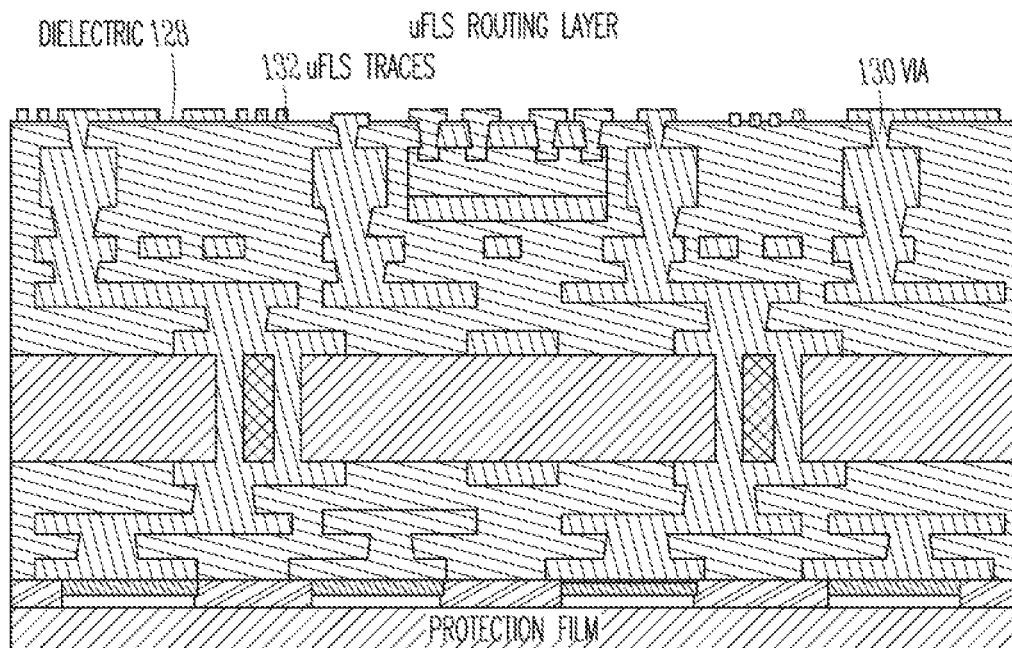

After the substrate 100 has been planarized to the level of the bridge die 126, a thin dielectric layer 128 may be then laminated on the bridge die 126 and the Cu pillars 124. Vias 130 through the thin dielectric layer 128 to the bridge die 126 and the Cu pillars 124 may be formed formed with laser drilling (using, as above, an excimer or $CO_2$ laser, for example). Alternatively, the vias 130 may be formed lithographically using a photo imagable dielectric or through double patterning. Forming the vias using lithographic techniques may be advantageous as alignment may be able to be more closely controlled than when a laser-based process is used. Using lithographic techniques may also improve the Cu plating thickness uniformity as filling of the vias and creation of uFLS traces for routing may be performed in different operations. FIG. 1E shows the substrate 100 after one or more metallizations to fill the vias 130 and create the uFLS traces 132 on the thin dielectric layer 128. The substrate 100 is now prepared for creation of the uFLS routing, having been planarized to meet the flatness specifications used for lithography. In various embodiments, only one layer containing uFLS (or VHD layer) may be used, as shown, or multiple uFLS layers may be used.

Figure 1F:
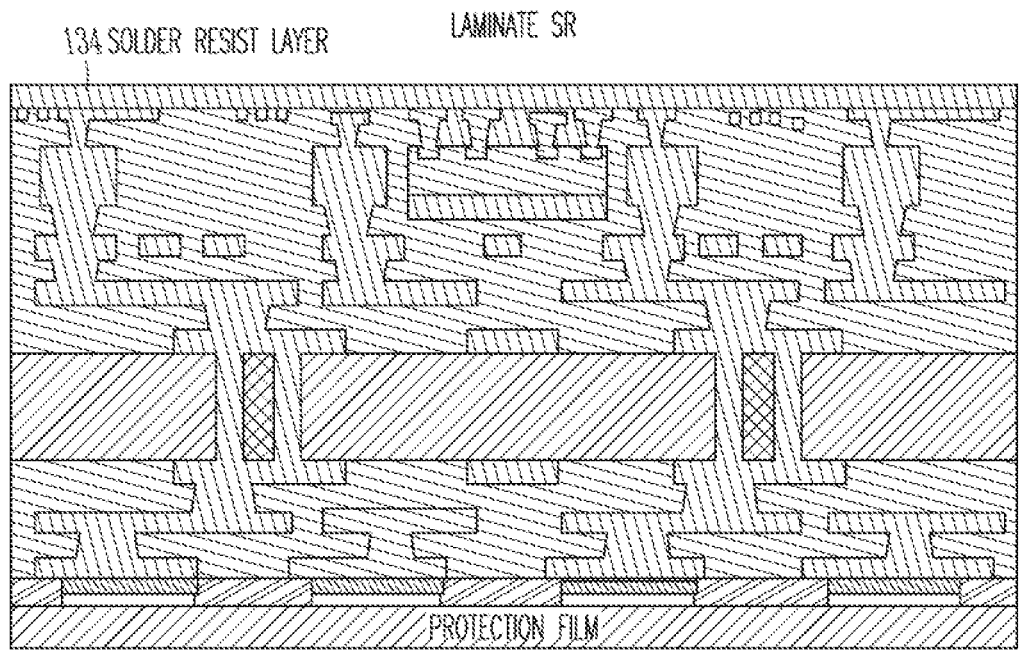

In FIG. 1F, a solder resist (SR) 134 is deposited on the vias 130 and the uFLS traces 132 on the thin dielectric layer 128. The solder resist 134 may have a thickness similar to the dielectric layer 112 and metal layer 114. The solder resist 134 may protect the vias 130 and the uFLS traces 132 prior to attaching die on the surface of the substrate 100.

Figure 1G:
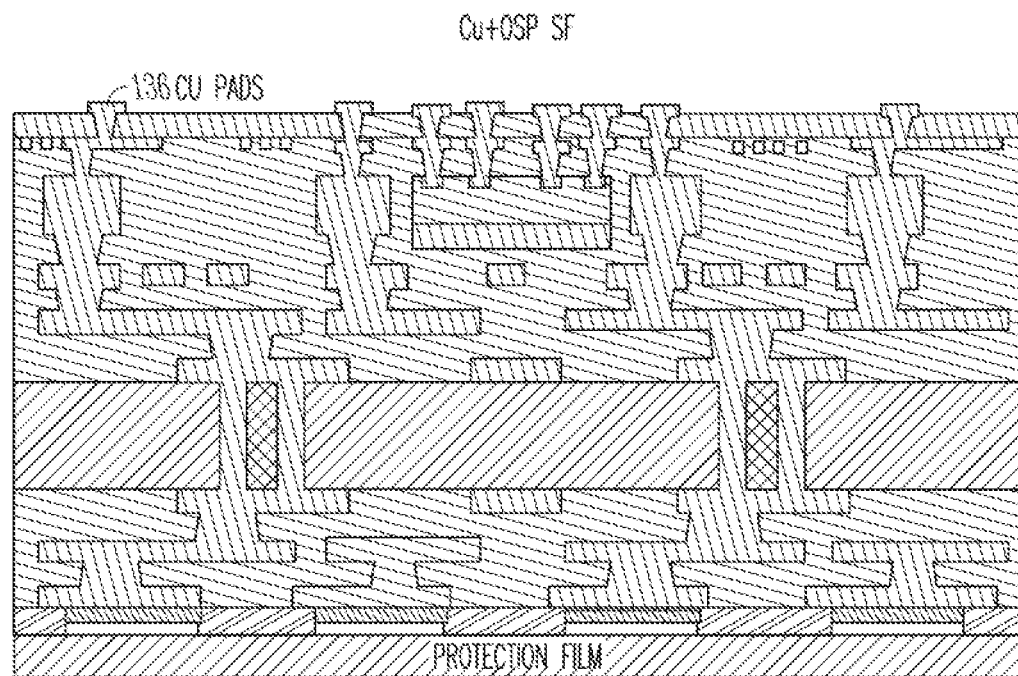

In FIG. 1G, a first level interconnect (FLI) may be formed on the solder resist 134. As shown, the FLI may be formed after lamination of the solder resist 134 by lithographically opening the solder resist 134. Cu pillars may then be patterned and plated on the holes opened in the solder resist 134, resulting in Cu pads 136 used for assembly. The Cu pads 136 can be coated by an organic surface protectant or a similar surface finish to control oxidation. The use of the uFLS traces in FIG. 1E and the FLI and Cu pillars 136 may permit a smaller bump pitch to be achieved.

Depending on the assembly requirements, the FLI may also take advantage of formation of the vias through a self-aligned process. Self-aligned FLI formation may begin with lithographic patterning of dry or liquid photoresist to form the uFLS routing layer. A second resist may then be patterned without stripping the first resist. This second layer may define the Cu FLI. After plating using Cu, both layers of photoresist may be stripped away and solder resist laminated on top. The solder resist 134 may then be removed to reveal the via. Self aligned vias may be especially useful for space transforming from a 40 μm bump pitch (or less) to the current bridge having 55 μm contacts as alignment to the bridge may be a limit of bridge scaling.

Figure 1H:
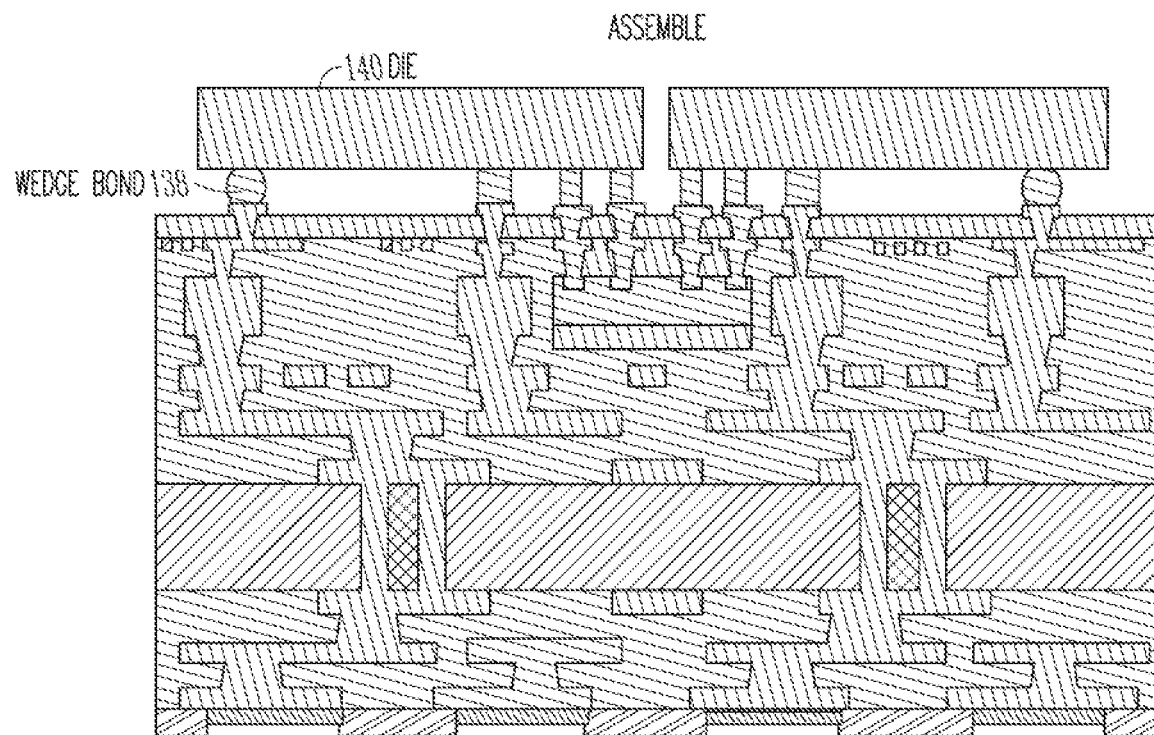

After the organic surface protectant is deposited, as shown in FIG. 1H, the die 140 may be attached to the substrate 100. The die 140 may be CPUs, memory, or any other IC to be connected across the bridge die 126. The die 140 may be attached to the Cu pads 136 through a Sn or Ag/Sn ball or wedge bond 138. The use of one or more uFLS layers, rather than a direct connection between the die 140 and the bridge die 126, as well as use of photo imagable dielectric and lithographic techniques may enable the bump pitch reduction. Although the cross-sectional areas shown in FIGS. 1A-1H illustrate only a single bridge die 126 connection between the die 140, and a single VHD layer, in other embodiments, multiple bridge die may effect connections between the die and/or more than one VHD layer may be used.

Figure 2A:
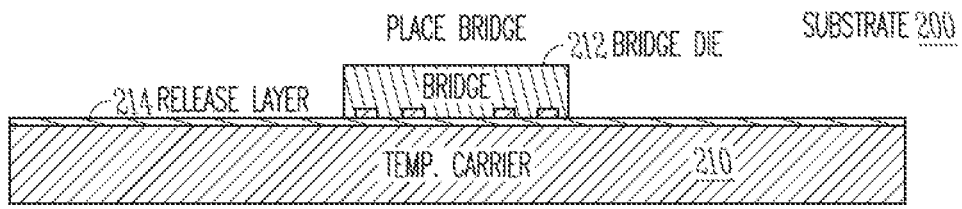
FIGS. 2A-2L illustrate cross-sectional views of a fabrication process using a bridge and VHD routing using a coreless substrate in accordance with some embodiments.

FIGS. 2A-2L illustrate cross-sectional views of a fabrication process using a bridge and VHD routing using a coreless substrate in accordance with some embodiments. Coreless creation of the bridge and VHD routing substrate 200 may be initiated essentially in the reverse order of FIGS. 1A-1H, building the substrate 200 inward (towards where the core is in FIGS. 1A-1H) rather than outwards. Warpage of the structure may be controlled by overmold and/or multiple glass cloth layers before being employed in a patch type architecture. Coreless creation of the bridge and VHD routing substrate 200 may be initiated as shown in FIG. 2A by placement of the bridge die 212 on top of a temporary carrier 210. The temporary carrier 210 may be formed from glass or another insulating structure and may be coated with a release layer 214 to permit the substrate 200 to eventually be removed from the temporary carrier 210.

After the bridge die 212 is placed on top of the temporary carrier 210, a seed layer 216 may be sputtered on the structure containing the bridge die 212. The seed layer 216 may cover the entire structure and may be formed from a metal that supports electrolytic plating of the FLI 212 after patterning of the structure, such as Cu. The thickness of the seed layer 216 may range, for example, from about 0.2 μm to about 1 μm. The patterning may be performed using a photolithographic process. Unlike the processing shown in FIGS. 1A-1H, because the FLI 218 is plated first, before the underlying VHD layers are formed, there may be more flexibility of choice with the metal used for the FLI 218. For example, rather than being limited to the use of Cu, any combination of Cu, Ni or Sn can be used, depending on product requirements. The bridge die 212 can be used for lithographic alignment of the FLI 218, although edge detection of the bridge die 212 may be difficult depending on the seed layer thickness.

After the FLI 218 is patterned, the seed layer 216 may be removed. The removal may be performed by wet or dry etching. As shown in FIG. 2C, a dielectric 220 may subsequently be laminated on the top side of the structure 200. The dielectric 220 may be laminated over the bridge die 212, FLI 218 and the exposed portion of the release layer 214 sufficiently to protect the bridge die 212 and the FLI 218.

Figure 2B:
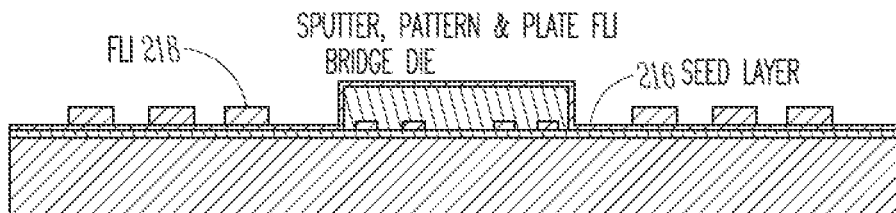
Figure 2C:
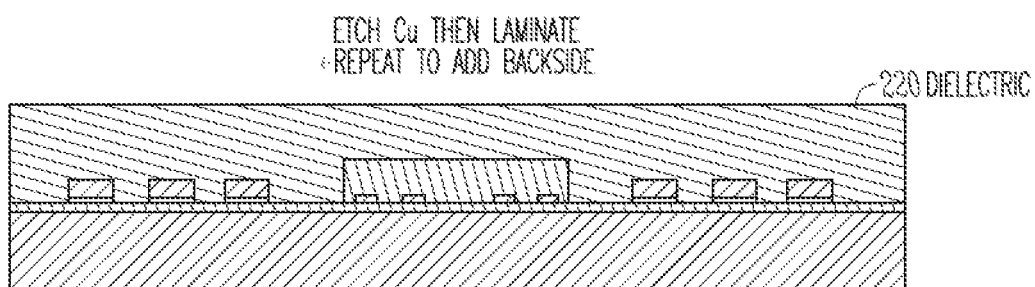
Figure 2D:
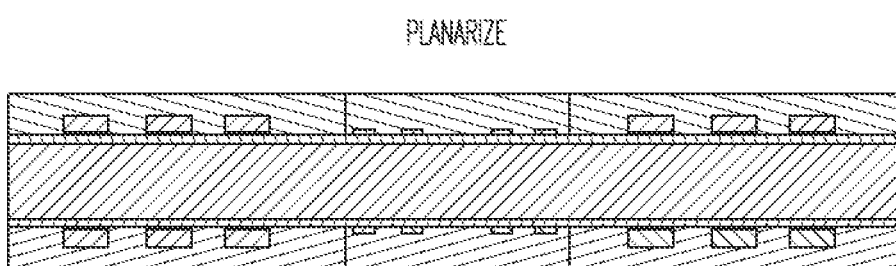

The carrier 210 can then be put back through the process line and the processes shown in FIGS. 2A-2C duplicated to place a bridge die 212 on the opposite side of the carrier 210. In some embodiments, fabrication may be performed simultaneously on both sides. However, such a process may have an open bridge die on the backside and thereby significantly increase handling risk to the bridge die 212. In any case, after lamination of the dielectric on the opposite side of the structure 200, the dielectric 220 is planarized to the bridge die 212 on both sides as shown in FIG. 2D. The bridge die 212 can be used for planarization endpoint detection. In some embodiments, the dielectric 220 may be removed to at the bridge die 212, while in other embodiments the dielectric 220 may be planarized to below the bridge die 212 to thin the bridge die 212. Thinning may be limited, however, to reduce die cracking risks. Post planarization the dielectric will be flat enough to support uFLS patterning.

Figure 2E:
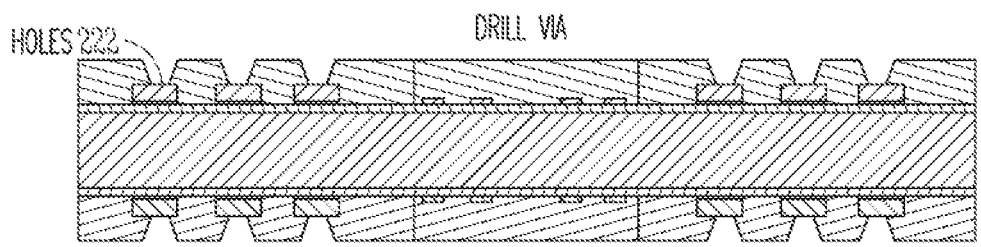

After planarization, holes 222 may be drilled into the dielectric 220 to expose the FLI 218 as shown in FIG. 2E. The holes 222 may be created using lithographic techniques and a wet etching process to create the holes 222. In some embodiments, the holes 222 may be formed with laser drilling, using a $CO_2$ or excimer laser.

Figure 2F:
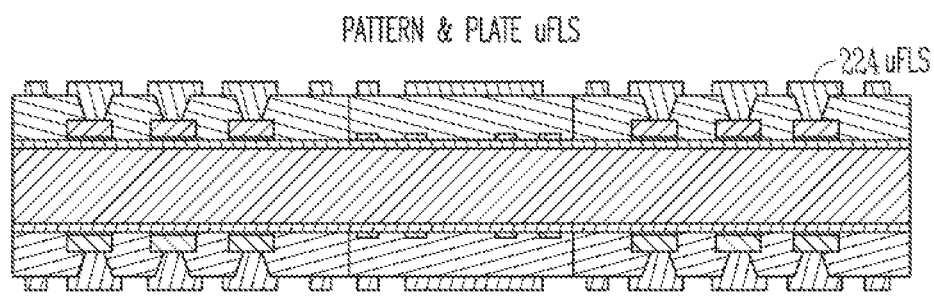

After the holes 222 have been created, a Cu layer may be deposited to create vias and uFLS 224, as shown in FIG. 2F. The combined thickness of the vias 222 and FLI pads 218 may be equal to the post planarization bridge die thickness. The bridge die thickness may be between 40 and 60 μm. In some embodiments, the thickness for the FLI pads 218 is about 20-30 μm leaving an additional 20 μm or so thickness to be spanned by the vias 222. This may ultimately limit the I/O density on the layer containing the FLI pads 218 due to the relationship between via depth and diameter, which is typically about 1:1. For example, a 20 μm via diameter resulting from a 20 μm via thickness may reduce the I/O density (assuming 2/2 μm line width/space ratio) from 150 I/O/mm to 75 I/O/mm compared to a 10 μm thickness via with a corresponding 10 μm width. To overcome this, as above, lithographic techniques and a wet etching process may be used to create the vias 222. This is done by first patterning the FLI pads 218 then using a second dry film resist to pattern the vias and uFLS 224, resulting in >2:1 aspect ratio. This may allow the thickness of the vias 222 to be 10 μm or below and at least double the I/O density.

Figure 2G:
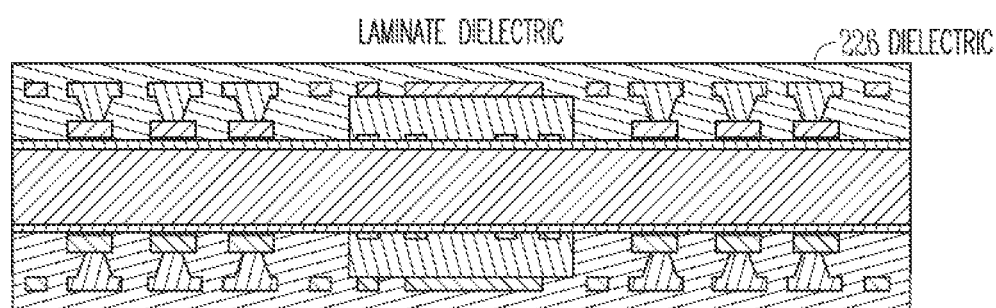

After formation of the first uFLS layer 224 additional uFLS layers can be added on top of the first uFLS layer 224. As shown in FIG. 2G, another dielectric layer 226 may be deposited on the first uFLS layer 224.

Figure 2H:
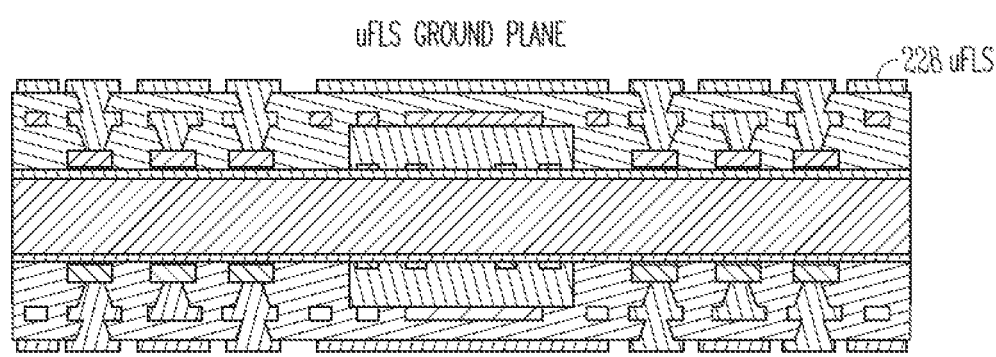

After the dielectric layer 226 is deposited, a second uFLS layer 228 may be patterned and deposited as shown in FIG. 2H. The second uFLS layer 228 may be formed from Cu and deposited using electrolytic plating. The second uFLS layer 228 may be a ground layer. Thus, portions of the first uFLS layer 224 and second uFLS layer 228 may be physically connected through vias while other portions may be isolated. Like the first uFLS layer 224, the second uFLS layer 228 may be disposed over the bridge die 212.

Figure 2I:
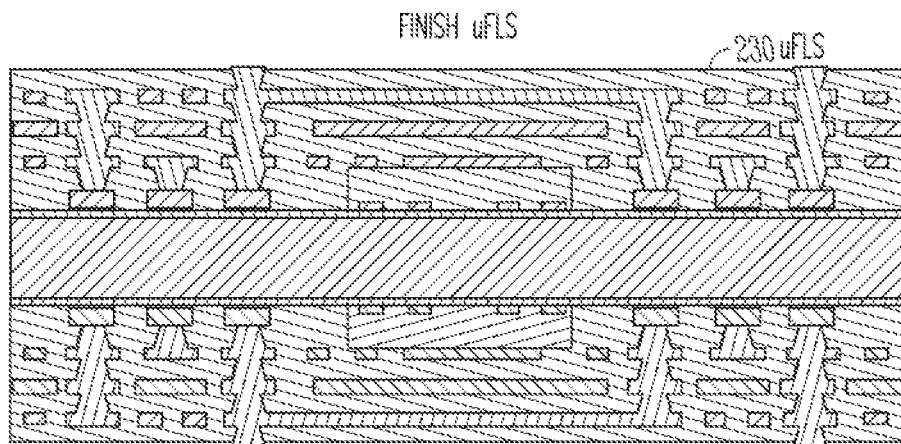
Figure 2J:
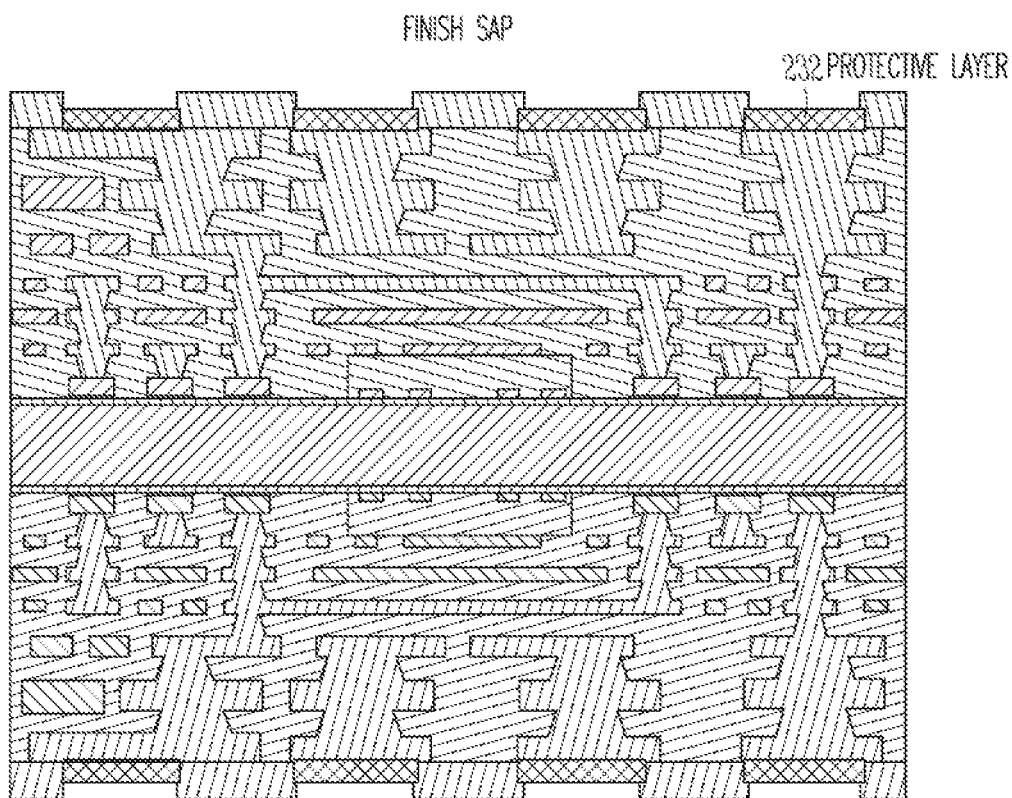

Additional uFLS layer(s) 230 may be formed using similar processes as above, as shown in FIG. 2I. Alternatively, or in addition, as shown in FIG. 2J a further process may be performed if additional VHD routing is not required. The additional layers can be made with glass cloth to increase the rigidity of the substrate 200 and control warpage. The top layers may include a dielectric layer in some portions of the structure 200 and a protective layer 232 in other portions of the structure.

Figure 2K:
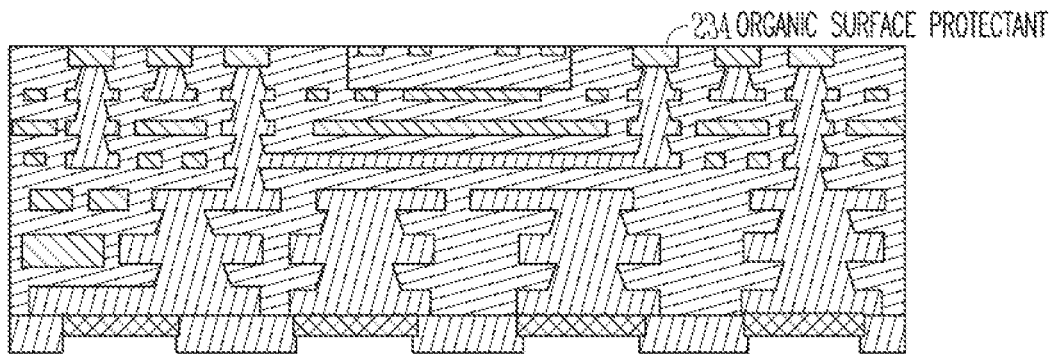
Figure 2L:
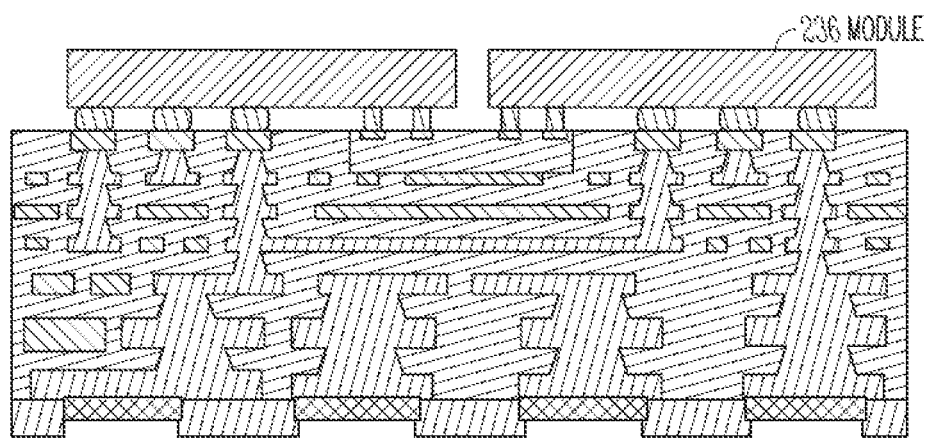

Once the final layers are fabricated, the carrier may be removed. As shown in FIG. 2K, the structure 200 is depaneled by the carrier 210 being separated from the remaining structure (the substrate). The release layer 214 is then etched away and a thin layer of organic surface protectant 234 applied to protect the substrate.

The structure 200 is then assembled by attaching ICs or other modules 236 to the released surface of the substrate. The structure 200 may thus contain active layers on which signals are routed, ground layers, and insulating layers separating the active and ground layers and through which vias connect routing on the active layers, as well as the bridge and die. The structure 200 may use standard bonding processes to attach the modules 236 to the substrate. The resulting substrate may be used as a patch for a PoINT application or used more traditionally as a coreless substrate for high performance mobile applications.

Figure 3:
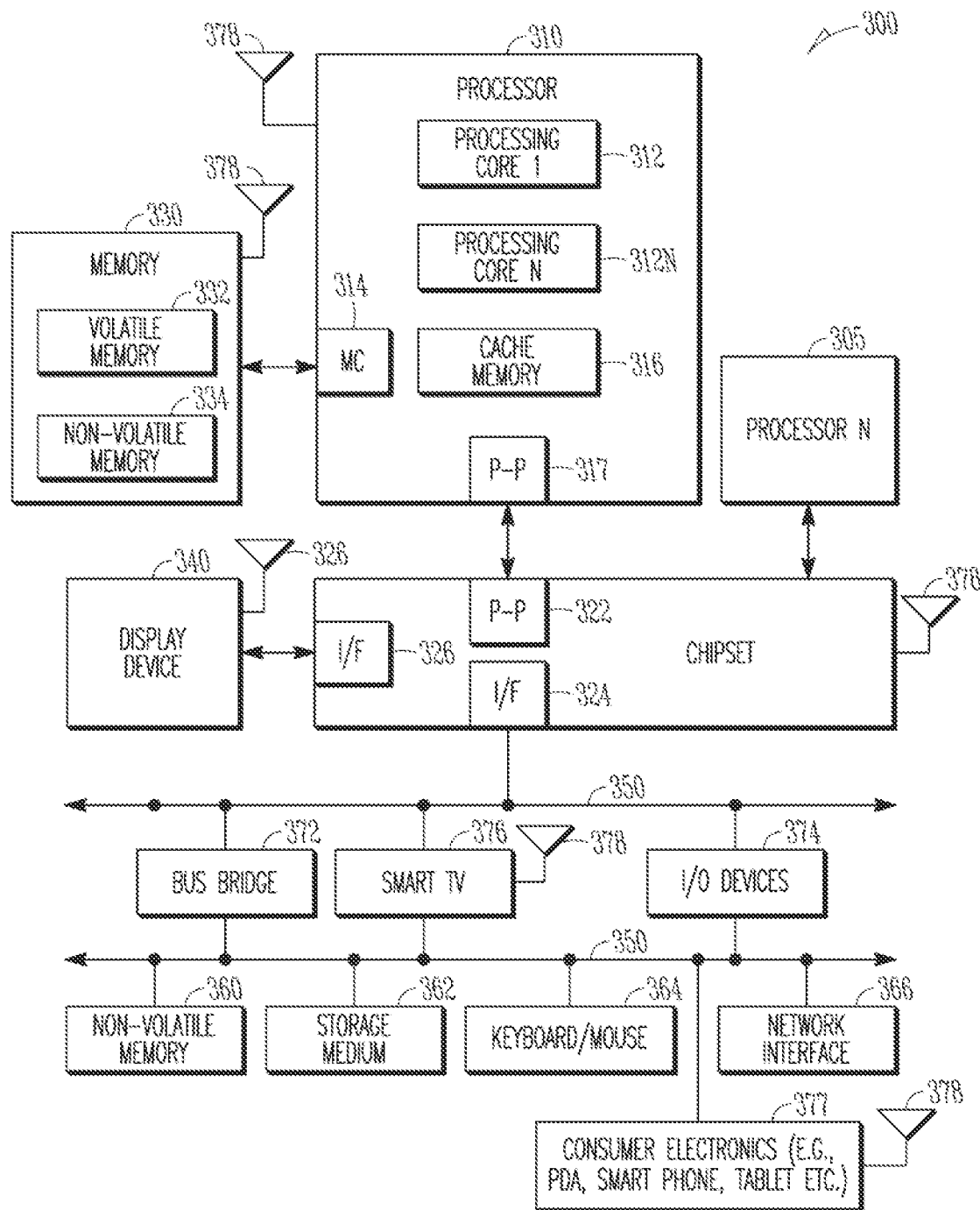
FIG. 3 illustrates a system level diagram in accordance with some embodiments.

An example of an electronic device using the microelectronic structure described above to show an example of a higher level device application for the disclosed subject matter. FIG. 3 illustrates a system level diagram in accordance with some embodiments. For instance, FIG. 3 depicts an example of an electronic device (e.g., system) including the structures as described in the present disclosure. FIG. 3 is included to show an example of a higher level device application for the present invention. In one embodiment, system 300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 300 is a system on a chip (SOC) system.

In one embodiment, processor 310 has one or more processing cores 312 and 312N, where 312N represents the Nth processor core inside processor 310 where N is a positive integer. In one embodiment, system 300 includes multiple processors including 310 and 305, where processor 305 has logic similar or identical to the logic of processor 310. In some embodiments, processing core 312 includes, but is not limited to, pre-fetch logic to fetch instructions, decode logic to decode the instructions, execution logic to execute instructions and the like. In some embodiments, processor 310 has a cache memory 316 to cache instructions and/or data for system 300. Cache memory 316 may be organized into a hierarchal structure including one or more levels of cache memory.

In some embodiments, processor 310 includes a memory controller 314, which is operable to perform functions that enable the processor 310 to access and communicate with memory 330 that includes a volatile memory 332 and/or a non-volatile memory 334. In some embodiments, processor 310 is coupled with memory 330 and chipset 320. Processor 310 may also be coupled to a wireless antenna 378 to communicate with any device configured to transmit and/or receive wireless signals. In one embodiment, the wireless antenna interface 378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 334 includes, but is not limited to, flash memory, phase change memory (PCM), read-only memory (ROM), electrically erasable programmable read-only memory (EEPROM), or any other type of non-volatile memory device.

Memory 330 stores information and instructions to be executed by processor 310. In one embodiment, memory 330 may also store temporary variables or other intermediate information while processor 310 is executing instructions. In the illustrated embodiment, chipset 320 connects with processor 310 via Point-to-Point (PtP or P-P) interfaces 317 and 322. Chipset 320 enables processor 310 to connect to other elements in system 300. In some embodiments of the invention, interfaces 317 and 322 operate in accordance with a PtP communication protocol such as the Intel® QuickPath Interconnect (QPI) or the like. In other embodiments, a different interconnect may be used.

In some embodiments, chipset 320 is operable to communicate with processor 310, 305N, display device 340, and other devices 372, 376, 374, 360, 362, 364, 366, 377, etc. Chipset 320 may also be coupled to a wireless antenna 378 to communicate with any device configured to transmit and/or receive wireless signals.

Chipset 320 connects to display device 340 via interface 326. Display 340 may be, for example, a liquid crystal display (LCD), a plasma display, cathode ray tube (CRT) display, or any other form of visual display device. In some embodiments of the invention, processor 310 and chipset 320 are merged into a single SOC. In addition, chipset 320 connects to one or more buses 350 and 355 that interconnect various elements 374, 360, 362, 364, and 366. Buses 350 and 355 may be interconnected together via a bus bridge 372. In one embodiment, chipset 320 couples with a non-volatile memory 360, a mass storage device(s) 362, a keyboard/mouse 364, and a network interface 366 via interface 324 and/or 304, smart TV 376, consumer electronics 377, etc.

In one embodiment, mass storage device 362 includes, but is not limited to, a solid state drive, a hard disk drive, a universal serial bus flash memory drive, or any other form of computer data storage medium. In one embodiment, network interface 366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into processor core 312.

Figure 4:
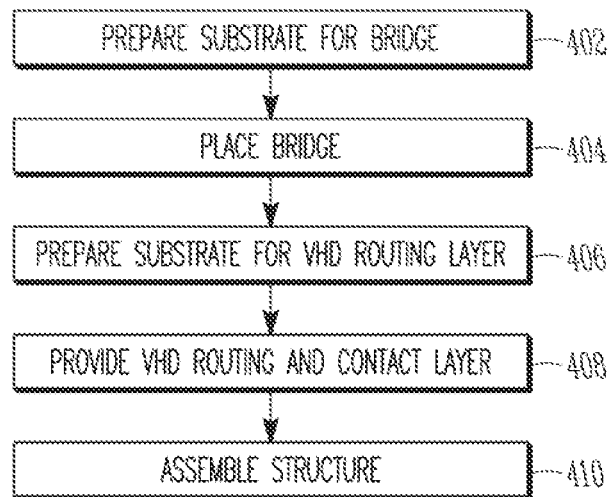
FIG. 4 illustrates a method of substrate fabrication in accordance with some embodiments.

FIG. 4 illustrates a method of substrate fabrication in accordance with some embodiments. The method shown in FIG. 4 may be similar to that show in FIGS. 1A-1H and be applied to create the device shown in FIG. 3. The method of FIG. 4 may be applied to a structure formed on a monolithic core. At operation 402, the substrate is prepared for the addition of the bridge die. The basic substrate may be a POR substrate, having a core and a number of interspaced dielectric and conductive (ground and non ground) layers. The POR substrate may be terminated with a dielectric layer. Vias may be drilled in the dielectric layer to portions of the underlying metal layer, either using a photolithographic or laser drilling process. Once the vias are created, Cu pillars may be formed using a photolithographic process.

At operation 404, the bridge die may be placed on the substrate that contains the pillars. The height of the pillars may be designed to be greater than that of the bridge die so that the pillars extend from the surface of the dielectric farther than the bridge die. The difference in height between the top of the bridge die and the top of the pillars may be about 1-30 µm.

At operation 406, the structure may be prepared for addition of the VHD layer. This may include laminating a dielectric layer (e.g., an ABF layer) over the structure containing the bridge die and pillars. After the lamination, the structure may be planarized to the top of the bridge die or slightly (about 1-2 µm) into the bridge die.

At operation 408, the VHD layer and contact layer may be provided. This may include laminating a dielectric layer on the planarized structure. The a dielectric layer may be drilled into using a lithographic process such that the pillars and contacts on the bridge die are exposed. Subsequently, an electroless process may be used to plate Cu on the structure and the uFLS routing layer formed by liftoff. The use of the lithographic process permits the line/spacing aspect of the uFLS routing layer to be finer than direct contact to the bridge die by the IC. In addition, at least some of the routing may be disposed on portions of the structure that do not overlie the pillars or bridge die. This process may be repeated to provide multiple uFLS routing layers prior to assembly.

After all of the uFLS routing layers are fabricated, an organic protective layer may then be deposited on the top uFLS routing layer. Vias may be drilled in the protective layer to expose the uFLS contacts to the pillars and the bridge die and subsequently metallized to form contacts to the underlying structure. ICs or other components may then be assembled in operation 410 by bonding the ICs to the contacts.

Figure 5:
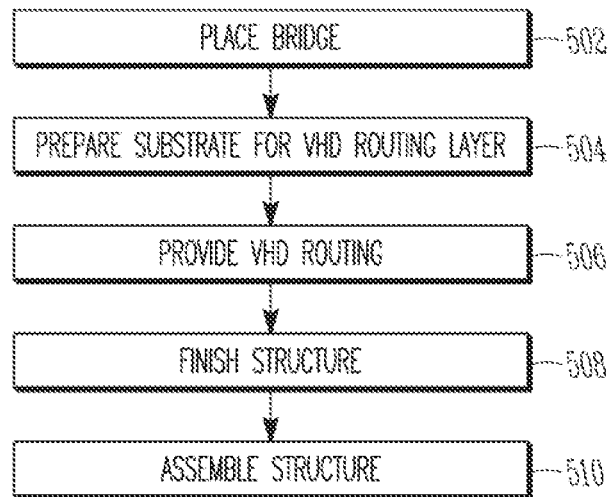
FIG. 5 illustrates a method of coreless substrate fabrication in accordance with some embodiments.

FIG. 5 illustrates a method of coreless substrate fabrication in accordance with some embodiments. The method shown in FIG. 5 may be similar to that show in FIGS. 2A-2L and be applied to create the device shown in FIG. 3. The method of FIG. 5 may be applied to a coreless structure. At operation 502, the bridge die may be placed on a carrier impregnated with a liftoff film. The bride die may have contacts that contact the liftoff film and are later used to connect to the ICs. The structure to be formed may be one or two sided, with preparation of the opposing side being performed after protection of the bridge die already provided on the structure.

After placement of the bridge, the substrate may be prepared for fabrication of the VHD routing layer at operation 504. This may include sputtering a thin metal layer over the structure containing the bridge die, patterning a photoresist, plating a FLI and, through liftoff, removing portions of the FLI to provide eventual contacts to the structure to be built. The contacts may be able to be precisely located due to the photoresist process to have a line/spacing of 2 µm. The bridge die and contacts may thus be automatically planarized to the same level. After formation of the FLI, the thin metal layer remaining may be etched away and a dielectric layer laminated on the structure. If desired, now that the bridge and contacts are protected by the ABF, the process up to this point may be applied to the backside of the carrier.

After the bridge die has been provided on the backside and protected via another ABF, both surfaces may be planarized to the bridge die level or, in some embodiments, slightly further. Vias may be drilled in the ABF to the contacts, either using a photolithographic or laser drilling process. Once the vias are created, at operation 506 a photolithographic process and subsequent plating may be used to pattern a uFLS layer and fill the vias.

At operation 508, the structure may be completed prior to assembly. The completion may include laminating a dielectric layer on the uFLS layer and bridge die and then patterning a uFLS ground plane layer on the dielectric layer. Subsequently, multiple routing (metal) and dielectric layers may be fabricated on the uFLS ground plane layer, finishing with a surface added protectant. After the addition of the surface added protectant, the structures on both sides of the carrier may be removed, the liftoff film etched away and an OSP used to protect the surface.

After all of the uFLS routing layers are fabricated, an organic protective layer may then be deposited on the (now) top layer on which the bridge die and contacts are exposed and/or the bottom layer. ICs or other components may then be assembled in operation 510 by bonding the ICs to the contacts on the surface of the structure and the surface of the bridge die.

The structures shown created by the processes in FIGS. 1A-1H and 2A-2L and described in FIGS. 4 and 5 may be used in a variety of manners. For servers, more components may be more tightly integrated, improving performance. Performance may also be improved by using the uFLS layers to do some of the routing as they have superior dielectric properties to the bridge bridge die. High performance mobile devices may also benefit from such structures. In such embodiments, next generation memories may require much higher I/O counts than today. In this segment, the ability to reconfigure and space transform the memory pinout may be quite valuable.

Examples

Example 1 is a semiconductor device comprising: a first set of alternating patterned conducting and insulating layers; and an embedded multi-die interconnect bridge disposed on an uppermost layer of the first set of layers, the bridge comprising ultra-fine line-space (uFLS) contacts; and die electrically connected to each other through the bridge, the die comprising contacts having at most about a 40 µm center-to-center pitch.

In Example 2, the subject matter of Example 1 optionally includes, further comprising: a monolithic core, the first set of layers disposed on a front side of the core.

In Example 3, the subject matter of Example 2 optionally includes, further comprising: a second set of alternating patterned conducting and insulating layers disposed on a back side of the core, a conducting layer of the first and second sets of alternating patterned conducting and insulating layers connected through vias in the core, the first and second set of alternating patterned conducting and insulating layers comprising layers of thicknesses between about 10-30 µm.

In Example 4, the subject matter of any one or more of Examples 1-3 optionally include, further comprising: conductive pillars surrounding the bridge, the conductive pillars having a same height as the bridge of about 40-60 µm, and a lateral insulating layer disposed between the bridge and the conductive pillars.

In Example 5, the subject matter of Example 4 optionally includes, further comprising: a second set of alternating patterned conducting and insulating layers disposed on the conductive pillars and the bridge, the second set of layers comprising: a first insulating layer adjacent to the bridge and the conductive pillars and having vias disposed therein, and a first conducting layer adjacent to the first insulating layer contacting the contacts on the bridge and the pillars and comprising uFLS traces.

In Example 6, the subject matter of Example 5 optionally includes, further comprising: a solder resist of about 10-30 µm disposed on the first conducting layer, and an interconnect layer disposed on the solder resist and connected to the first conductive layer through vias in the solder resist.

In Example 7, the subject matter of Example 6 optionally includes that: the die are bonded to and connected to the bridge through the interconnect layer.

In Example 8, the subject matter of any one or more of Examples 1-7 optionally include, further comprising: die comprising contacts having at most about a 40 µm center-to-center pitch and connected electrically connected to each other through the bridge and through at least one uFLS layer of the conductive layers on which the bridge is disposed.

In Example 9, the subject matter of any one or more of Examples 1-8 optionally include that: the conducting layers comprise copper and the insulating layers comprise an Ajinomoto build-up film (ABF) layer.

Example 10 is a method of fabricating a substrate, the method comprising: lithographically fabricating a first set of alternating conducting and insulating layers of thicknesses between about 10-30 µm, the conducting layers comprising ultra-fine line-space (uFLS) routing and connected through vias in the insulating layers; providing an embedded multi-die interconnect bridge comprising ultra-fine line-space (uFLS) contacts; and bonding die to the bridge to electrically connect the die through the bridge and through the uFLS routing, the die comprising contacts having at most about a 40 µm center-to-center pitch through which the die is bonded to the bridge.

In Example 11, the subject matter of Example 10 optionally includes that: the first set of layers are fabricated on a front side of a monolithic core comprising glass, and the bridge is deposited on a top layer of the first set of layers.

In Example 12, the subject matter of Example 11 optionally includes, further comprising: drilling vias in the core and lithographically patterning and etching a second set of alternating patterned conducting and insulating layers on a back side of the core such that a conducting layer of the first and second sets of layers are electrically connected through the vias.

In Example 13, the subject matter of any one or more of Examples 11-12 optionally include that providing the bridge comprises: depositing a photoresist layer on the top layer; lithographically creating vias in the photoresist layer by etching areas of the photoresist layer and depositing a conductor on the photoresist layer containing the etched areas; removing the photoresist layer to provide conductive pillars having a height of about 40-60 µm and expose the top layer; placing the bridge on the top layer, the bridge having a height that is at most the height of the conductive pillars; depositing a bridge insulating layer on the bridge and pillars to cover and separate the bridge and pillars; and planarizing the bridge insulating layer to expose the pillars and the bridge contacts.

In Example 14, the subject matter of Example 13 optionally includes that: a thickness of the bridge contacts is 6 µm, and the bridge is used for endpoint detection for planarization such that the planarizing comprises grinding 1-2 µm into the bridge contacts before terminating the planarization.

In Example 15, the subject matter of any one or more of Examples 13-14 optionally include that: the height of the pillars and the bridge contacts are about equal, and planarization is set above the bridge such that the planarizing comprises terminating the planarization prior to grinding into the bridge contacts.

In Example 16, the subject matter of any one or more of Examples 13-15 optionally include, further comprising: depositing a first insulating layer on the bridge and the conductive pillars; etching vias in the first insulating layer to correspond to the contacts and the pillars; depositing a first conductive layer on the first insulating layer having the vias; planarizing the first conductive layer; lithographically patterning the planarized first conductive layer to form uFLS traces; depositing a solder resist of about 10-30 µm on the patterned first conductive layer; opening holes in the solder resist to correspond to the uFLS traces; and forming a first level interconnect (FLI) on the solder resist by plating a second conductive layer on the solder resist to form pillars in the holes and lithographically patterning the second conductive layer to form uFLS contact pads, wherein the die are bonded to the uFLS contact pads.

In Example 17, the subject matter of any one or more of Examples 13-16 optionally include, further comprising: depositing and lithographically patterning a second set of alternating insulating and conducting layers on the bridge and the conductive pillars in which in each insulating layer of the second set of layers: vias are etched, one of the conductive layers is deposited, planarized and lithographically patterned to form uFLS traces; depositing a solder resist of about 10-30 µm on an uppermost conductive layer; opening holes in the solder resist to correspond to the uFLS traces; and forming an interconnect layer on the solder resist by plating another conductive layer on the solder resist to form pillars in the holes and lithographically patterning the other conductive layer to form uFLS contact pads, wherein the die are bonded to the uFLS contact pads.

In Example 18, the subject matter of any one or more of Examples 10-17 optionally include that: the bridge is placed on a temporary carrier comprising a liftoff layer such that the bridge contacts contact the liftoff layer, and the first set of layers are fabricated on the bridge, the method further comprising removing the temporary carrier using the liftoff layer prior to bonding the die to the bridge.

In Example 19, the subject matter of Example 18 optionally includes that fabricating the first set of layers comprises: sputtering a seed layer on the bridge and liftoff layer, lithographically patterning, on the seed layer, interconnect layer uFLS contacts to which the die is to be bonded and thereafter removing an exposed portion of the seed layer, laminating a bridge insulating layer on the bridge and the interconnect layer uFLS contacts having a height of about 20-30 µm, planarizing the bridge insulating layer to expose the bridge free from exposing the interconnect layer uFLS contacts, drilling holes in the bridge insulating layer to expose the interconnect layer uFLS contacts, and fabricating of the first set of layers by depositing an initial conductive layer and lithographically patterning the initial conductive layer to form vias having a height of at most about 10 µm and the uFLS routing, and subsequently depositing and lithographically patterning the alternating insulating and conducting layers, the insulating layers having vias corresponding with the uFLS routing to permit the conductive layers to electrically connect.

In Example 20, the subject matter of Example 19 optionally includes, further comprising: after laminating the bridge insulating layer and prior to planarizing the bridge insulating layer, duplicating operations on an opposite side of the carrier such that a second bridge, a second set of interconnect layer uFLS contacts and a second bridge insulating layer are formed on the opposite side of the carrier and thereafter duplicating processes such that after the removing the temporary carrier a pair of substrates are obtained.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Embodiments of the inventive subject matter may be referred to herein, individually and/or collectively, by the term "embodiment" merely for convenience and without intending to voluntarily limit the scope of this application to any single embodiment or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:
1. A semiconductor device, comprising:
a plurality of alternating patterned first conducting and first insulating layers;
an interconnect bridge above the plurality of alternating patterned conducting and insulating layers;
a plurality of conductive pillars adjacent to sides of the interconnect bridge, the plurality of conducive pillars having a same height as the interconnect bridge;
a second insulating layer laterally between the plurality of conductive pillars and the interconnect bridge;
a third insulating layer above and on the second insulating layer, above and in direct contact with an uppermost surface of the plurality of conductive pillars, and above and on the interconnect bridge, the third insulating layer having a bottommost surface;
a plurality of vias in the third insulating layer, the plurality of vias coupled to the conductive pillars and to the interconnect bridge, wherein the plurality of vias have a bottommost surface at a same level as the bottommost surface of the third insulating layer;
a plurality of traces above and on the third insulating layer;
a first die above the plurality of traces, the first die coupled to the interconnect bridge and to the plurality of conductive pillars;

a second die above the plurality of traces, the second die coupled to the interconnect bridge and to the plurality of conductive pillars; and a fourth insulating layer over the third insulating layer, the fourth insulating layer intervening between the third insulating layer and the first die, and the fourth insulating layer intervening between the third insulating layer and the second die.

2. The semiconductor device of claim 1, wherein the interconnect bridge couples the first die to the second die.

3. The semiconductor device of claim 1, further comprising:

a solder resist layer on the plurality of traces.

4. The semiconductor device of claim 3, further comprising:

a second plurality of vias in the solder resist layer.

5. The semiconductor device of claim 3, wherein the solder resist has a thickness in the range of 10-30 microns.

6. The semiconductor device of claim 1, further comprising:

a monolithic core between the interconnect bridge and the plurality of alternating patterning first conducting and first insulating layers.

7. The semiconductor device of claim 1, wherein the first die comprises contacts having at most a 40 micron center-to-center pitch.

8. The semiconductor device of claim 7, wherein the second die comprises contacts having at most a 40 micron center-to-center pitch.

9. A system, comprising:

a memory; and a processor coupled to the memory, the processor, comprising:

a plurality of alternating patterned first conducting and first insulating layers;

an interconnect bridge above the plurality of alternating patterned conducting and insulating layers;

a plurality of conductive pillars adjacent to sides of the interconnect bridge, the plurality of conducive pillars having a same height as the interconnect bridge;

a second insulating layer laterally between the plurality of conductive pillars and the interconnect bridge;

a third insulating layer above and on the second insulating layer, above and in direct contact with an uppermost surface of the plurality of conductive pillars, and above and on the interconnect bridge, the third insulating layer having a bottommost surface;

a plurality of vias in the third insulating layer, the plurality of vias coupled to the conductive pillars and to the interconnect bridge, wherein the plurality of vias have a bottommost surface at a same level as the bottommost surface of the third insulating layer;

a plurality of traces above and on the third insulating layer;

a first die above the plurality of traces, the first die coupled to the interconnect bridge and to the plurality of conductive pillars;

a second die above the plurality of traces, the second die coupled to the interconnect bridge and to the plurality of conductive pillars; and a fourth insulating layer over the third insulating layer, the fourth insulating layer intervening between the third insulating layer and the first die, and the fourth insulating layer intervening between the third insulating layer and the second die.

10. The system of claim 9, further comprising:

a chipset coupled to the processor.

11. The system of claim 9, further comprising:

a display device coupled to the processor.

12. The system of claim 9, further comprising:

a smart TV coupled to the processor.

13. The system of claim 9, further comprising:

a network coupled to the processor.

14. The system of claim 9, wherein the interconnect bridge couples the first die to the second die.

15. The system of claim 9, further comprising:

a solder resist layer on the plurality of traces.

16. The system of claim 15, further comprising:

a second plurality of vias in the solder resist layer.

17. The system of claim 15, wherein the solder resist has a thickness in the range of 10-30 microns.

18. The system of claim 9, further comprising:

a monolithic core between the interconnect bridge and the plurality of alternating patterning first conducting and first insulating layers.

19. The system of claim 9, wherein the first die comprises contacts having at most a 40 micron center-to-center pitch.

20. The system of claim 19, wherein the second die comprises contacts having at most a 40 micron center-to-center pitch.

* * * * *